US 6,458,649 B1

(12) United States Patent
Zahurak et al.

(10) Patent No.: US 6,458,649 B1
(45) Date of Patent: Oct. 1, 2002

(54) METHODS OF FORMING CAPACITOR-OVER-BIT LINE MEMORY CELLS

(75) Inventors: John K. Zahurak; Kunal R. Parekh; Mark Fischer, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/360,349

(22) Filed: Jul. 22, 1999

(51) Int. Cl.$^7$ ............................................. H01L 21/8242
(52) U.S. Cl. ........................................ 438/253; 438/396
(58) Field of Search ........................... 257/303, 306, 257/906, 908; 438/239, 244, 250, 253, 387, 393, 396

(56) References Cited

U.S. PATENT DOCUMENTS

| | | | |
|---|---|---|---|
| 5,279,989 A | | 1/1994 | Kim |
| 5,296,400 A | | 3/1994 | Park et al. |
| 5,383,088 A | * | 1/1995 | Chapple-Sokol et al. ... 257/306 |
| 5,488,011 A | * | 1/1996 | Figura et al. ............... 438/253 |
| 5,627,095 A | * | 5/1997 | Koh et al. .................. 438/672 |
| 5,663,092 A | | 9/1997 | Lee |
| 5,670,404 A | | 9/1997 | Dai |
| 5,688,713 A | * | 11/1997 | Linliu et al. ................ 438/253 |
| 5,706,164 A | * | 1/1998 | Jeng ............................ 257/296 |
| 5,721,154 A | | 2/1998 | Jeng |
| 5,780,338 A | * | 7/1998 | Jeng et al. .................. 438/253 |
| 5,789,289 A | | 8/1998 | Jeng |
| 5,789,304 A | | 8/1998 | Fischer et al. |
| 5,792,687 A | | 8/1998 | Jeng et al. |
| 5,837,577 A | | 11/1998 | Cherng |
| 5,874,756 A | | 2/1999 | Ema et al. |
| 6,060,351 A | | 5/2000 | Parkeh et al. ............... 438/253 |

FOREIGN PATENT DOCUMENTS

| | | |
|---|---|---|
| EP | 06029408 | 2/1994 |
| EP | 09074174 | 3/1997 |
| EP | 10289986 | 10/1998 |

OTHER PUBLICATIONS

*Merriam Webster's Collegiate Dictionary*—Tenth Edition, ©1996, p. 168 (3 pages in all).
*Merriam Webster's Collegiate Dictionary*—Tenth Edition, ©1996, p. 250 (3 pages in all).
U.S. patent application Ser. No. 09/359,956, Tran, filed Jul. 22, 1999.

* cited by examiner

*Primary Examiner*—Olik Chaudhuri
*Assistant Examiner*—Hoai Pham
(74) *Attorney, Agent, or Firm*—Wells St. John P.S.

(57) ABSTRACT

Methods of forming capacitor-over-bit line memory cells are described. In one embodiment, a bit line contact opening is etched through conductive bit line material. In one implementation, a bit line contact opening is etched through a previously-formed bit line. In one implementation, a bit line contact opening is etched after forming a bit line.

30 Claims, 9 Drawing Sheets

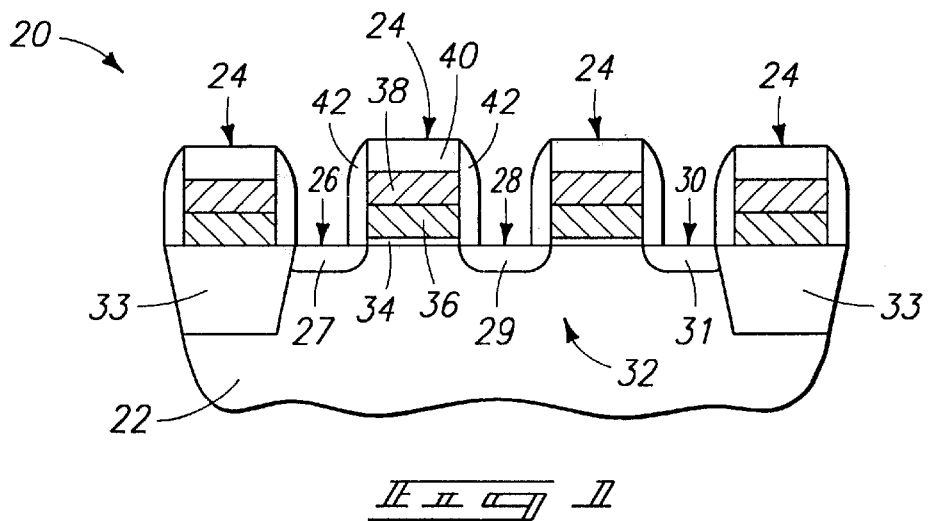
_Fig. 1_
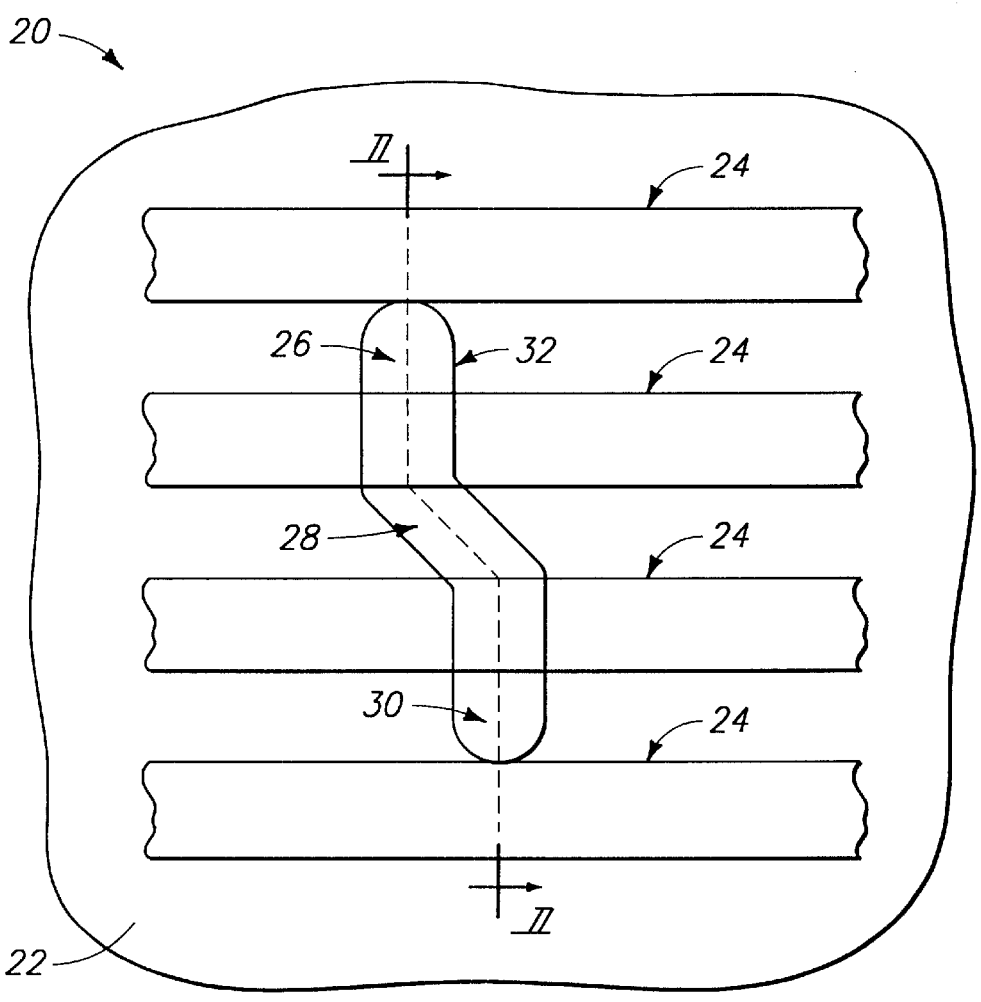
_Fig. 2_

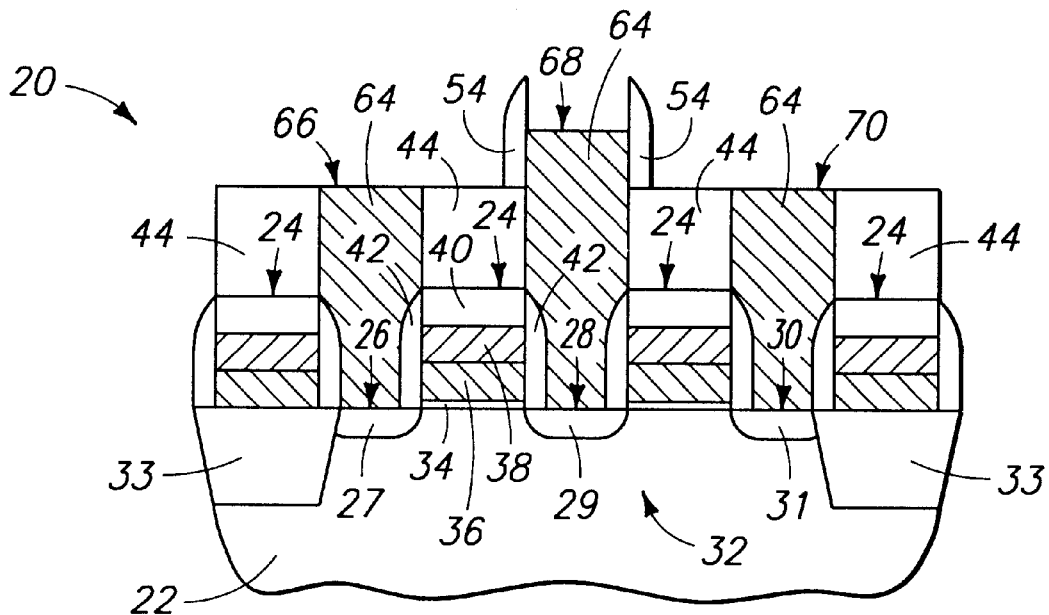
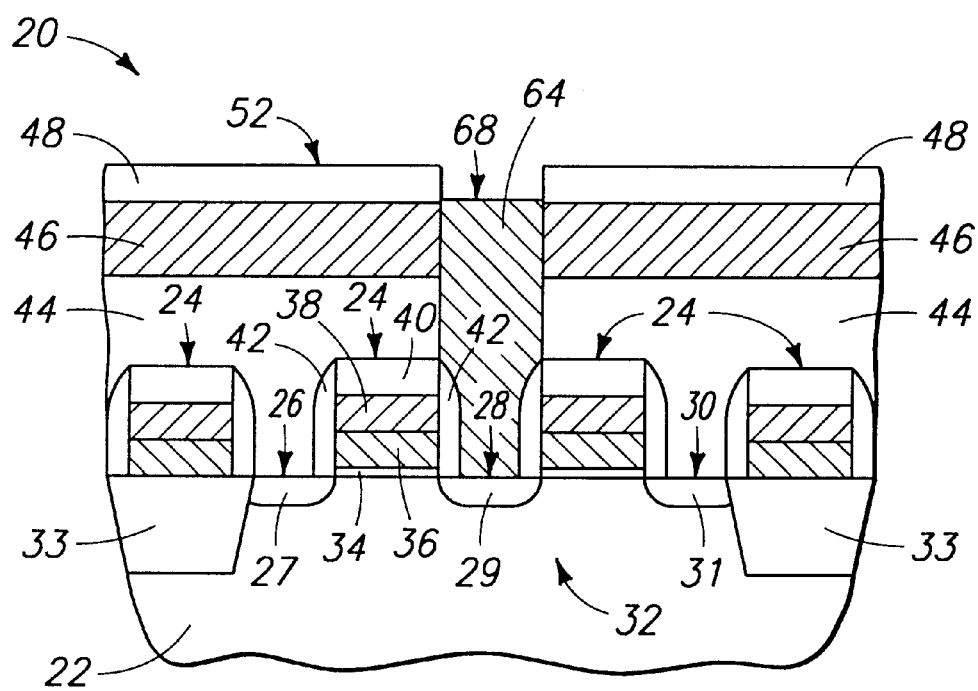

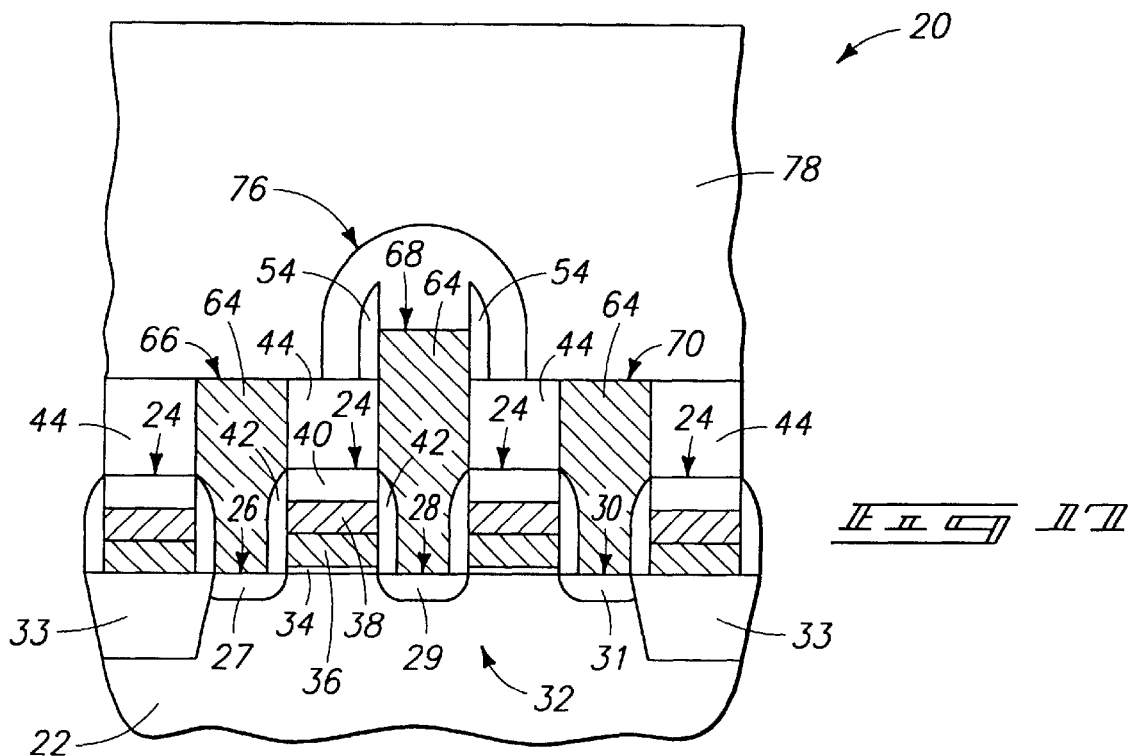
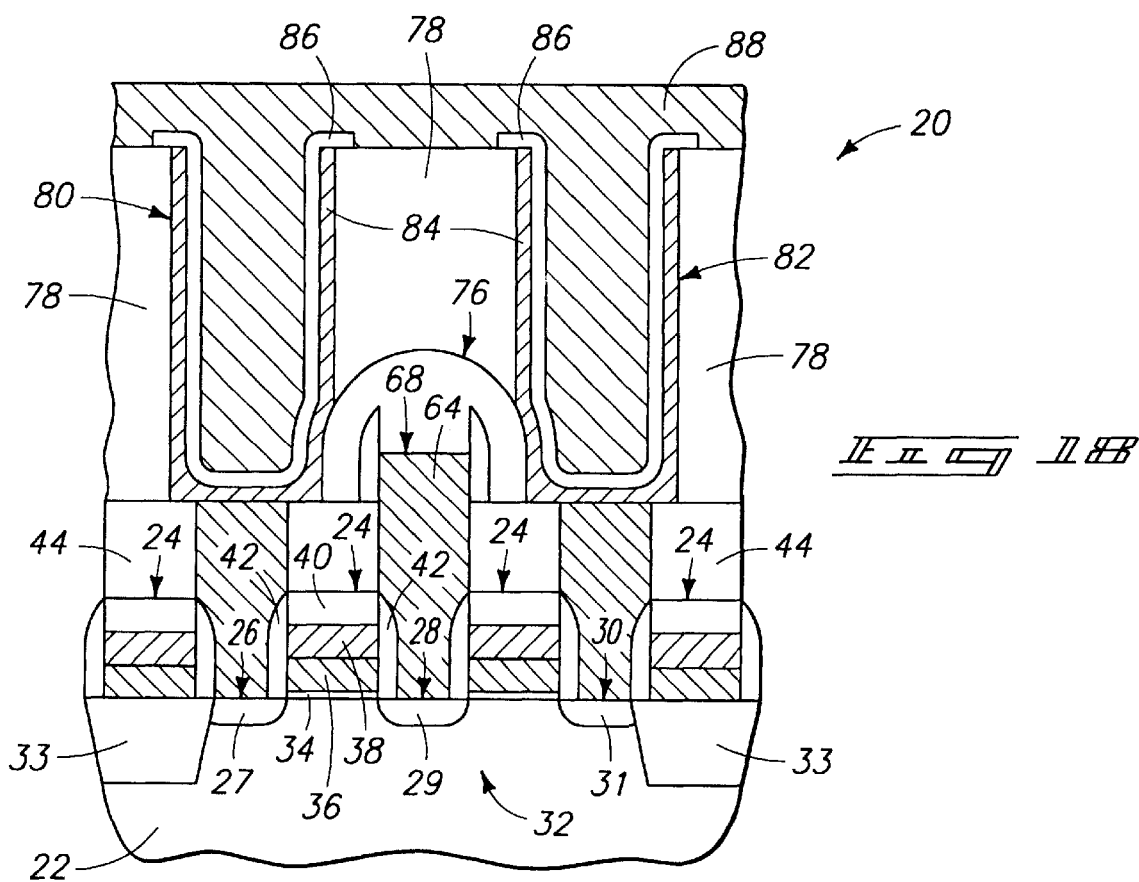

METHODS OF FORMING CAPACITOR-OVER-BIT LINE MEMORY CELLS

TECHNICAL FIELD

This invention relates to methods of forming capacitor-over-bit line memory cells.

BACKGROUND OF THE INVENTION

Semiconductor processing involves a number of processing steps in which individual layers are masked and etched to form semiconductor components. Mask alignment is important as even small misalignments can cause device failure. For certain photomasking steps, proper alignment is extremely critical to achieve proper fabrication. In others, design rules are more relaxed allowing for a larger margin for alignment errors. Further, there is a goal to reduce or minimize the number of steps in a particular processing flow. Minimizing the processing steps reduces the risk of a processing error affecting the finished device.

This invention arose out of needs associated with improving the manner in which semiconductor memory arrays, and in particular capacitor-over-bit line memory arrays, are fabricated.

SUMMARY OF THE INVENTION

Methods of forming capacitor-over-bit line memory cells are described. In one embodiment, a bit line contact opening is etched through conductive bit line material. In one implementation, a bit line contact opening is etched through a previously-formed bit line. In one implementation, a bit line contact opening is etched after forming a bit line.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with one embodiment of the present invention.

FIG. 2 is a top plan view of the FIG. 1 wafer fragment.

FIG. 13 is a view of the FIG. 11 wafer fragment at a different processing step.

FIG. 14 is a top view of the FIG. 13 wafer fragment.

FIG. 17 is a view of the FIG. 16 wafer fragment at a different processing step.

FIG. 18 is a view of the FIG. 17 wafer fragment at a different processing step.

DETAILED DESCRIPTION OF THE PREFERRED EMBODIMENTS

Figure 3:
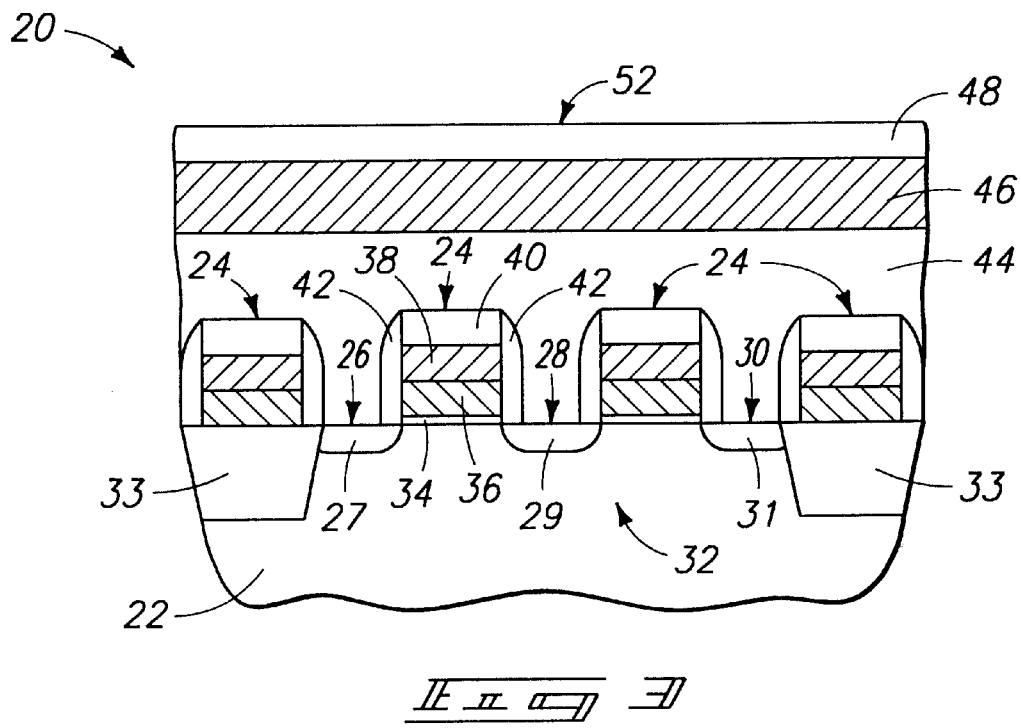
FIG. 3 is a view of the FIG. 1 wafer fragment at a different processing step.

This disclosure of the invention is submitted in furtherance of the constitutional purposes of the U.S. Patent Laws "to promote the progress of science and useful arts" (Article 1, Section 8).

Referring to FIGS. 1 and 2, a semiconductor wafer fragment in process is shown generally at 20 and includes semiconductive substrate 22. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A plurality of spaced-apart word lines 24 are formed over substrate 22 and define individual substrate locations 26, 28, and 30 with which electrical communication is desired. Substrate locations 26, 30 on opposite sides of substrate location 28 constitute locations with which electrical communication will be established with individual storage capacitors. Substrate location 28 constitutes a location with which electrical communication will be established with a bit line. In a preferred embodiment, the substrate locations comprise diffusion regions 27, 29, and 31 respectively, which are received within substrate 22.

Word lines 24 and substrate locations 26, 28, and 30 are formed relative to an active area 32 which is isolated from other active areas by isolation regions 33 which can be formed through conventional techniques, such as shallow trench isolation. Each word line includes a gate oxide layer 34, a polysilicon layer 36 and a silicide layer 38. An insulative cap 40 is provided, as are insulative sidewall spacers 42. Such constitutes but one word line construction. Accordingly, other word line constructions and/or materials can be utilized. As used herein, the term "cap" is defined to mean "to form a cap over or to crown" or something that fulfills this purpose.

Referring to FIG. 3, an insulative material layer 44 is formed over word lines 24. An exemplary material is borophosphosilicate glass (BPSG). Such layer can be subsequently reflowed and planarized to provide a generally planar uppermost surface. A conductive bit line material layer 46 is formed over the substrate and substrate locations 26, 28, and 30. An exemplary material is conductively doped polysilicon. An insulating cap layer 48 is formed over layer 46 and can comprise materials such as $Si_3N_4$ or $SiO_2$.

Figure 4:
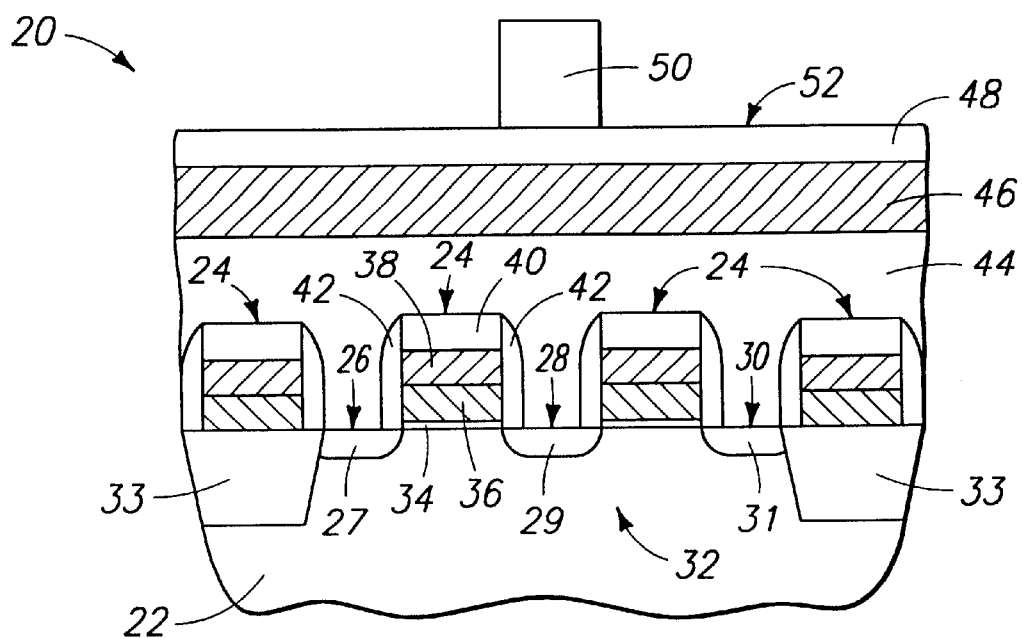
FIG. 4 is a view of the FIG. 3 wafer fragment at a different processing step.

Referring to FIG. 4, a patterned masking layer 50 is formed over substrate 22 and defines a bit line pattern.

Figure 5:
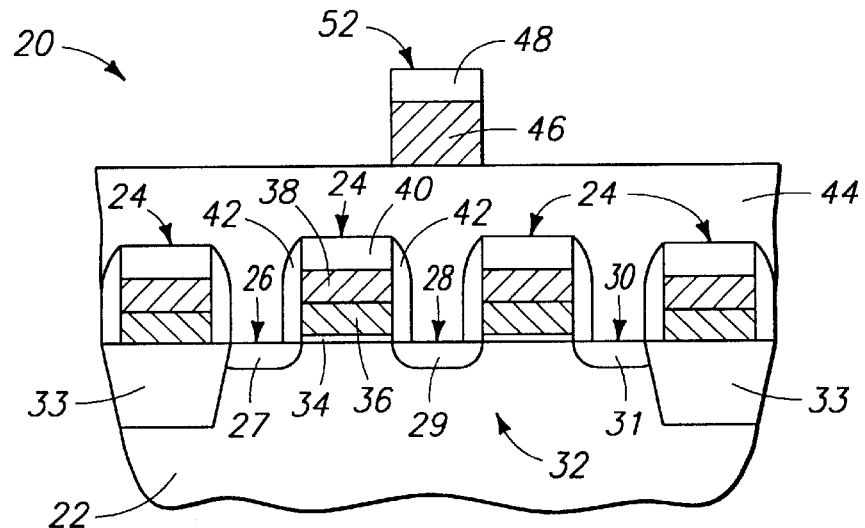
FIG. 5 is a view of the FIG. 4 wafer fragment at a different processing step.
Figure 6:
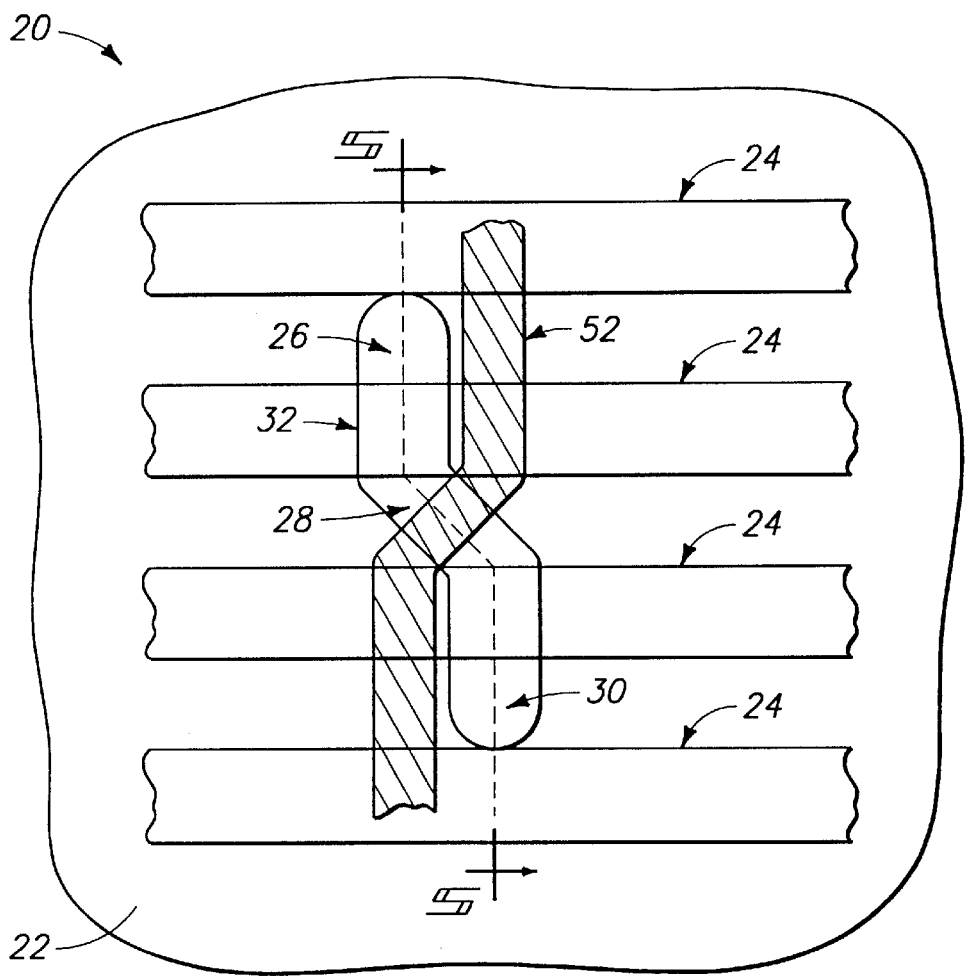
FIG. 6 is a top view of the FIG. 5 wafer fragment.

Referring to FIG. 5, material of the insulating cap layer 48 and conductive bit line material 46 is etched to form a bit line 52. Masking layer 50 is subsequently removed. FIG. 6 shows a top plan view of bit line 52, with its insulating cap removed for clarity.

Figure 7:
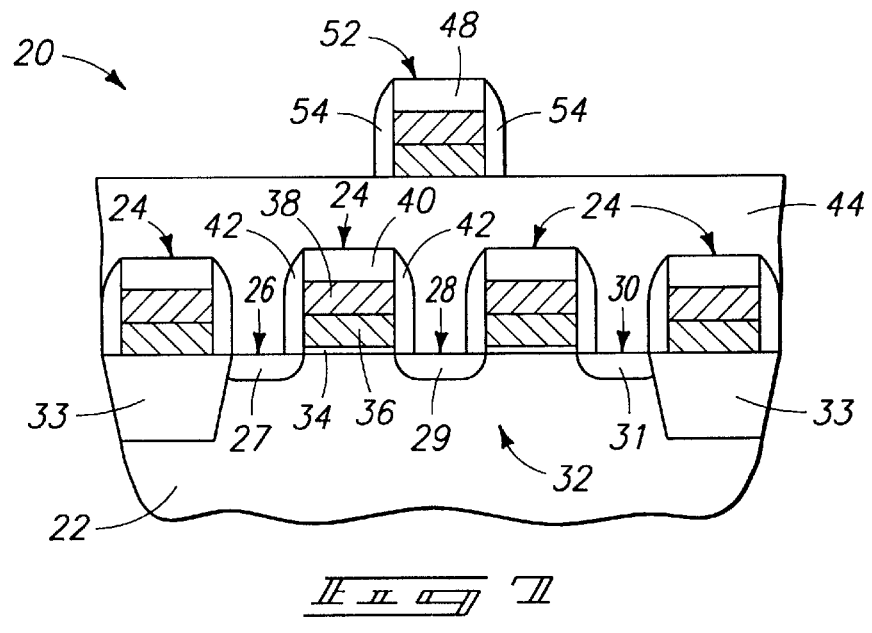
FIG. 7 is a view of the FIG. 5 wafer fragment at a different processing step.
Figure 8:
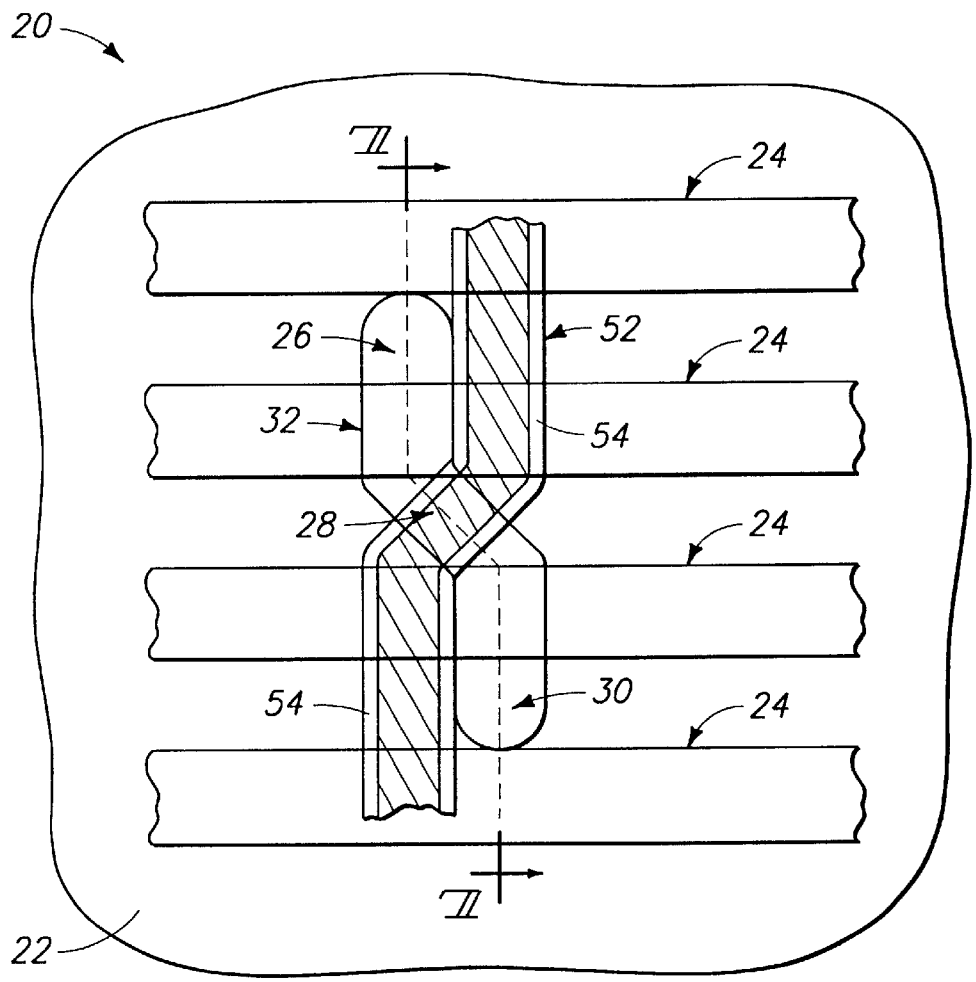
FIG. 8 is a top view of the FIG. 7 wafer fragment.

Referring to FIGS. 7 and 8, sidewall spacers 54 are formed over conductive portions of bit line 52 and its insulating cap 48.

Figure 9:
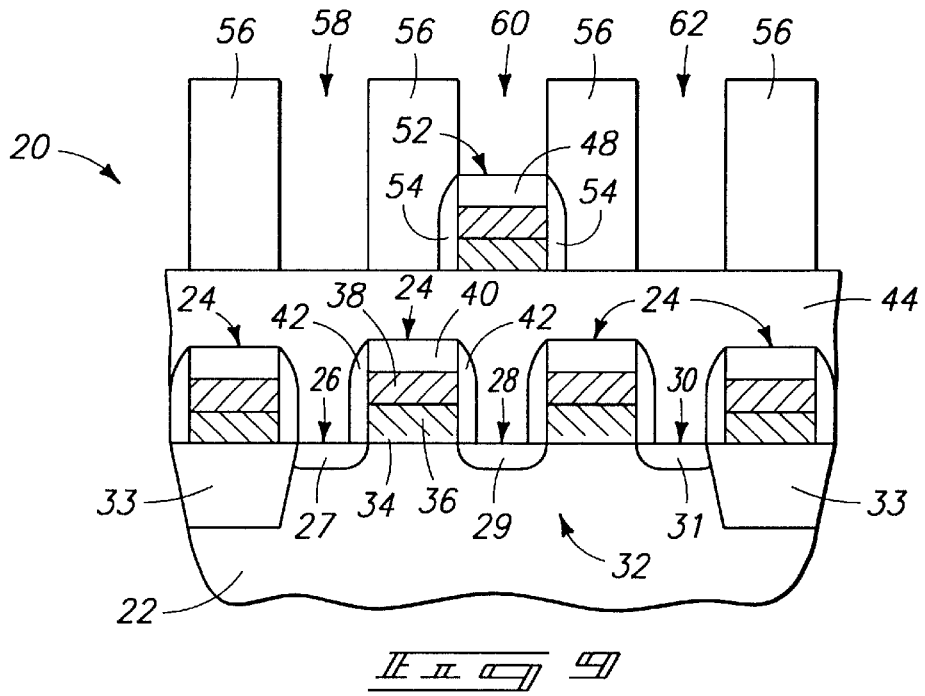
FIG. 9 is a view of the FIG. 7 wafer fragment at a different processing step.
Figure 10:
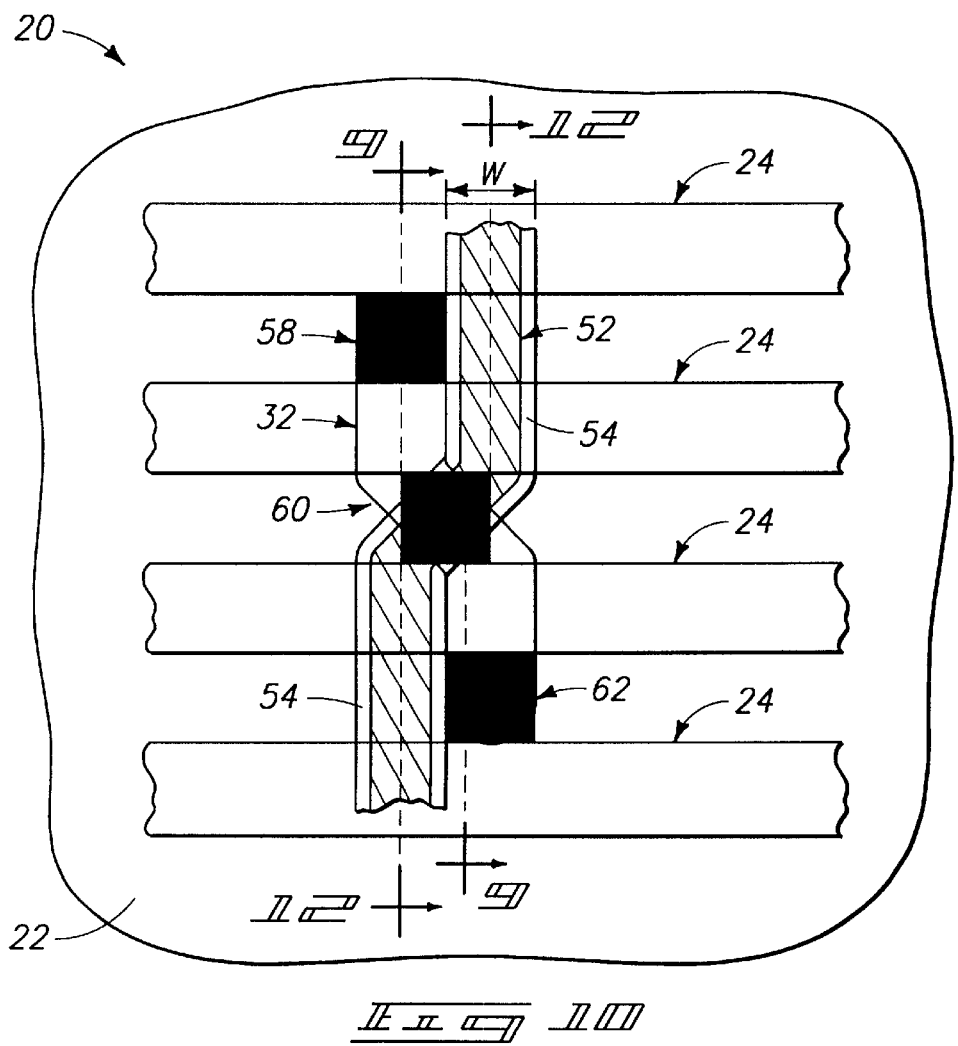
FIG. 10 is a top view of the FIG. 9 wafer fragment.

Referring to FIGS. 9 and 10, a patterned masking layer 56, e.g. photoresist, is formed over substrate 22 and defines a plurality of openings 58, 60, 62. For purposes of clarity, openings 58, 60, and 62 are shown in FIG. 10 as black squares or rectangles. The openings are formed over substrate locations 26, 28, and 30 respectively. In the illustrated example, bit line 52 has a lateral width W and opening 60 is formed over the entirety of the lateral width of a portion of bit line 52.

Figure 11:
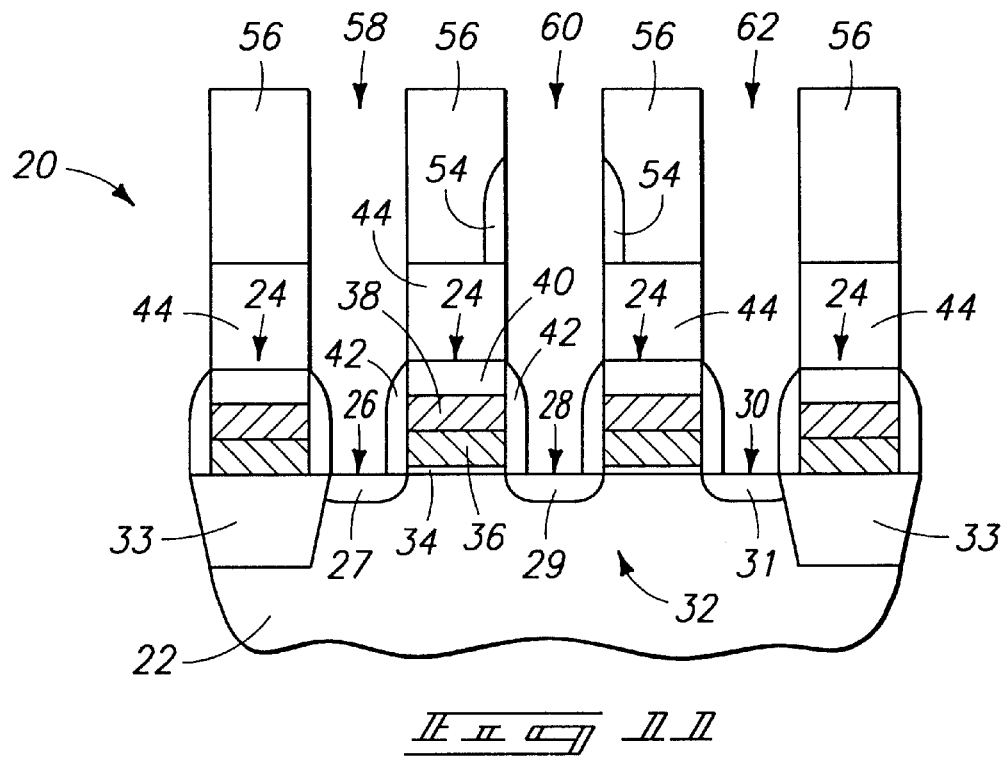
FIG. 11 is a view of the FIG. 9 wafer fragment at a different processing step.
Figure 12:
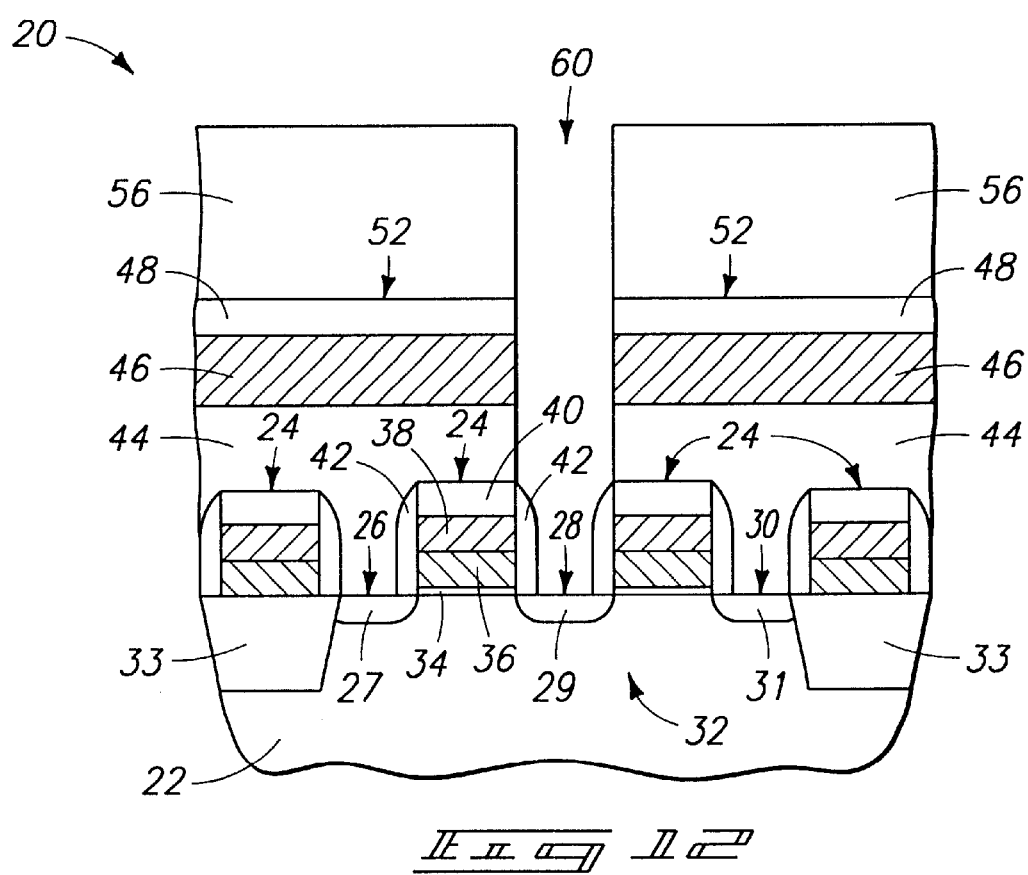
FIG. 12 is a top view along line 12—12 in FIG. 10 of the FIG. 11 wafer fragment.

Referring to FIGS. 11 and 12, conductive bit line material within opening 60 is removed to define a bit line contact opening. In a preferred embodiment, substrate location 28 is also outwardly exposed. Such exposure can occur during the removal of the conductive bit line material, or through subsequent processing. In one preferred embodiment, etching is conducted entirely through the conductive bit line material, through insulative layer 44 to proximate diffusion region 29. In a most preferred embodiment, openings 58 and 62 are contemporaneously formed with opening 60 and constitute capacitor contact openings over their respective substrate locations. The etching of bit line contact opening 60 preferably exposes conductive bit line material 46, as shown in FIG. 12. The forming of the above-described openings, e.g. the removal of the conductive bit line material to form the bit line contact opening, can take place before the patterning and etching of the conductive material to ultimately form the bit lines.

Referring to FIGS. 13 and 14, conductive interconnect material 64 is formed over and in electrical communication with individual substrate locations 26, 28, and 30. An exemplary material is conductively doped polysilicon which can be deposited over the substrate and subsequently etched back to isolate individual conductive plugs 66, 68, and 70. Conductive plug 68, as shown in FIG. 14, is in electrical communication with diffusion region 29 and bit line material 46 which was not removed.

Alternate processing can take place to form the above-described bit line contact openings and capacitor contact openings. By way of example only, after spacer formation over the bit line (FIG. 7), a masking layer can be formed over the bit line, and a portion of the bit line's insulative cap can be removed to expose underlying conductive bit line material. A layer of insulative material such as BPSG can be formed over the bit line and word lines, with a subsequent patterning step defining openings over areas generally corresponding to openings 58, 60, and 62 (FIG. 10). With such openings having been formed, separate etching can now take place to form desired bit line contact openings and capacitor contact openings. In one embodiment, the etching of the contact openings is conducted utilizing etch chemistries which etch the conductive bit line material and insulative layer 44 at about the same rate, and which are selective to materials from which the insulative caps and sidewalls of the bit lines and/or the word lines are formed. Such enables the openings to be formed to be generally self-aligned to the word lines. Following formation of the contact openings, a conductive material such as conductively-doped polysilicon can be deposited therewithin, and etched back or otherwise portions thereof removed to isolate conductive plugs within the openings. Processing can now take place substantially as described below with respect to FIGS. 15–18.

Alternatively, after formation of the bit lines and the above-described removal of the insulative cap portion of the bit line, a layer of insulative material, e.g. BPSG, can be formed and the bit line contact opening and capacitor contact openings subsequently etched. A thick layer of polysilicon can be deposited over the substrate and to within the openings. Such layer can be subsequently patterned into storage node layers within the capacitor openings, with subsequent processing including depositing a cell dielectric layer and cell plate layer.

Figure 15:
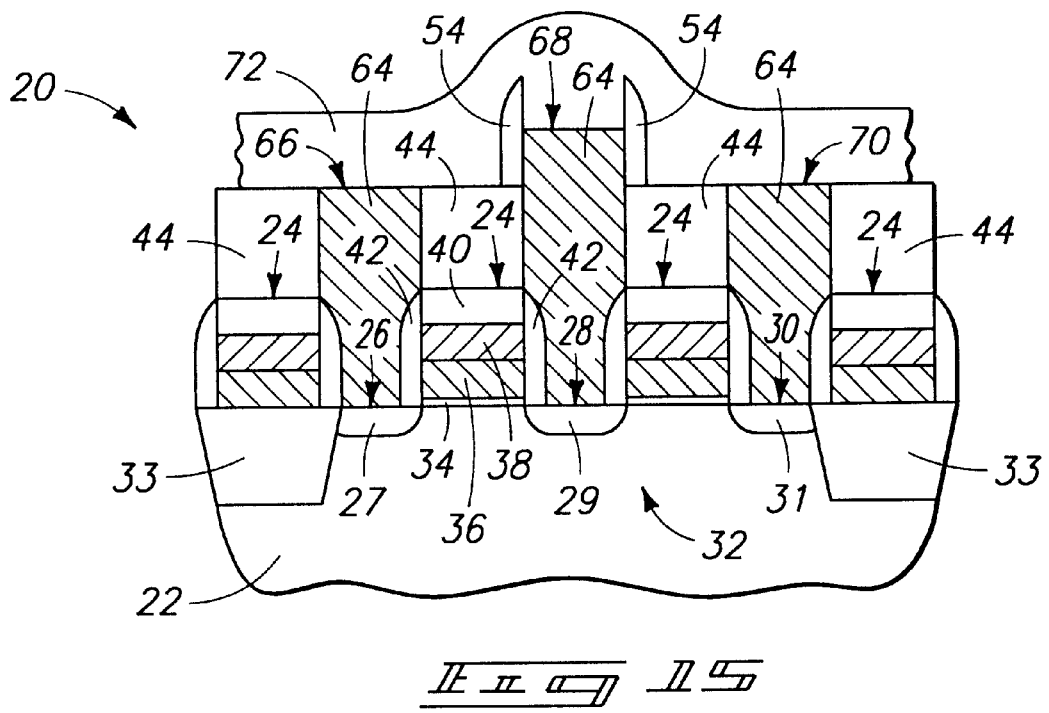
FIG. 15 is a view of the FIG. 13 wafer fragment at a different processing step.

Referring to FIG. 15, an insulative material layer 72 is formed over the substrate and preferably over the conductive material within all of contact openings 58, 60, and 62. An exemplary material is nitride. Other materials include those materials respective to which a subsequently formed layer of insulative material can be etched as will become apparent below.

Figure 16:
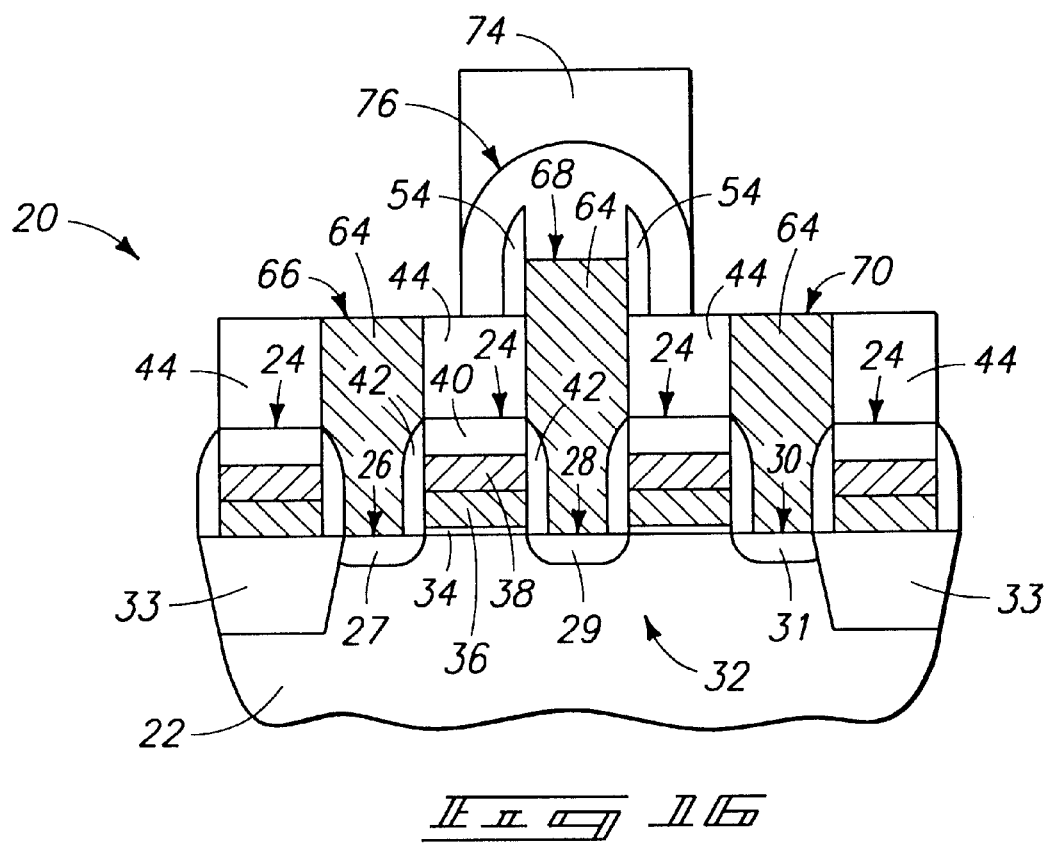
FIG. 16 is a view of the FIG. 15 wafer fragment at a different processing step.

Referring to FIG. 16, a patterned masking layer 74 is formed over substrate 22 and unmasked portions of insulative material layer 72 are removed to form an insulative cover 76 over plug 68. Such removal also preferably exposes conductive interconnect material 64 over diffusion regions 27, 31 respectively. Alternately and more preferred, a spacer etch, such as a dry etch of layer 72 can be conducted to form the insulative cover thereby eliminating a masking step.

Referring to FIG. 17, an insulative material layer 78 is formed over substrate 22. An exemplary material is BPSG.

Referring to FIG. 18, a pair of capacitor openings 80, 82 are etched through layer 78, elevationally over the bit line and preferably expose the respective conductive plugs over which each is formed. In a preferred embodiment, such openings are substantially selectively etched relative to material comprising insulative cover 76. Accordingly, openings 80, 82 can be formed to be generally self-aligned to insulative cover 76 and hence the bit line. A pair of storage capacitors are formed within openings 80, 82 and include a conductive storage node layer 84, a cell dielectric layer 86, and a cell plate layer 88.

Advantages of the above methods can include providing storage capacitors which are self-aligned to the bit line thereby minimizing alignment precision concerns. Additionally, during formation of the capacitor openings 80, 82, etch chemistries can be manipulated to etch portions of the capacitor plugs selectively relative to material encapsulating the word lines. Such can provide storage capacitors which are self-aligned to the word lines. Additionally, advantages can be achieved by forming the bit line contact openings and capacitor contact openings contemporaneously such as reductions in mask counts and processing steps. Moreover, by forming such openings contemporaneously, improvements in alignment criticality are made over processing techniques in which the capacitor contact openings are formed after the bit contact openings. For example, in one capacitor-over-bit line processing scenario the bit line contact openings are etched before the capacitor contact openings, and subsequently filled with conductive material which also forms part of the bit line. Such conductive material is patterned and etched into individual bit lines and a layer of BPSG is formed thereover. The capacitor openings are then patterned and etched through the BPSG, with alignment relative to conductive bit plug material being critical, e.g. a misalignment of the capacitor openings can expose conductive bit plug material and cause a fatal short. By contemporaneously etching the bit line contact openings and capacitor contact openings, such alignment criticality is reduced if not eliminated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor-over-bit line memory cell comprising;
   forming a pair of spaced-apart word lines over a substrate having a substrate location therebetween with which electrical communication with a bit line is desired;
   forming conductive bit line material over the word lines and the substrate location;
   after forming the conductive bit line material, providing patterned bit line material by removing at least some of the conductive bit line material and outwardly exposing said substrate location; and
   forming conductive interconnect material over the substrate location and in electrical communication with both the substrate location and the patterned bit line material, wherein:
      the removing of the conductive bit line material comprises also exposing other substrate locations different from the substrate location between the pair of spaced-apart word lines with which electrical communication with a bit line is desired; and
      the forming of the conductive interconnect material comprises forming said conductive interconnect material over and in electrical communication with said other substrate locations.

2. The method of claim 1, wherein the forming of the conductive bit line material over the word lines comprises patterning and etching said conductive bit line material to form a bit line from the patterned bit line material.

3. The method of claim 2, wherein the removing of said at least some of the conductive bit line material comprises etching through said bit line.

4. The method of claim 1, wherein the forming of the conductive bit line material over the word lines comprises patterning and etching said conductive bit line material to form a bit line having a lateral width, and the removing of the at least some of the conductive bit line material comprises removing conductive bit line material within an entirety of the lateral width of a portion of the bit line.

5. The method of claim 1, wherein the removing of the at least some of the conductive bit line material comprises etching entirely through the conductive bit line material.

6. A method of forming a capacitor-over-bit line memory cell comprising:
   forming a pair of spaced-apart word lines over a substrate having a substrate location therebetween with which electrical communication with a bit line is desired;
   forming conductive bit line material over the word lines and the substrate location;
   after forming the conductive bit line material, providing patterned bit line material by removing at least some of the conductive bit line material and outwardly exposing said substrate location; and
   forming conductive interconnect material over the substrate location and in electrical communication with both the substrate location and the patterned bit line material, wherein:
      the removing of the conductive bit line material comprises also exposing other substrate locations different from the substrate location between the pair of spaced-apart word lines with which electrical communication with a bit line is desired; and
      the forming of the conductive interconnect material comprises forming said conductive interconnect material over and in electrical communication with said other substrate locations; and further comprising:
         forming an insulative material layer over the interconnect material;
         exposing the interconnect material only over the other substrate locations;
         forming a different insulative material layer over the substrate;
         etching capacitor openings through the different insulative material layer over the other substrate locations and exposing the interconnect material thereover; and
         forming capacitors within the capacitor openings and in electrical communication with respective interconnect material therewithin.

7. A method of forming a capacitor-over-bit line memory cell comprising:
   forming a pair of spaced-apart word lines over a substrate having a diffusion region received therein and with which electrical communication with a bit line is desired;
   forming an insulative material layer over the word lines;
   forming a patterned bit line over the insulative material layer;
   after forming the patterned bit line, etching a contact opening through the Insulative material layer to proximate the diffusion region, the etching also outwardly exposing a portion of the patterned bit line;
   forming conductive material within the contact opening and in electrical communication with the diffusion region and the patterned bit line;
   wherein forming a patterned bit line comprises forming conductive bit line material over the insulative material layer;
   forming an insulative cap over the conductive bit line material; and
   wherein the etching of the contact opening comprises selectively etching said insulative material layer and said conductive bit line material relative to material from which the insulative cap is formed.

8. The method of claim 7, wherein the etching of the contact opening comprises etching through the patterned bit line.

9. The method of claim 7, wherein the forming of the patterned bit line comprises:
   forming conductive bit line material over the insulative material layer; and
   forming an insulative cap over the conductive bit line material and further comprising prior to the forming of the contact opening, removing a portion of the insulative cap from over the conductive bit line material, the etching of the contact opening comprising separately etching through conductive bit line material over which the insulative cap was removed.

10. The method of claim 7 further comprising prior to the etching of the contact opening, removing a portion of the insulative cap from over the conductive bit line material, the etching of the contact opening comprising separately selectively etching through the conductive bit line material over which the insulative cap was removed.

11. The method of claim 7 wherein:
   the removing of the conductive bit line material comprises also exposing other substrate locations different from the substrate location between the pair of spaced-apart word lines with which electrical communication with a bit line is desired; and the forming of the conductive interconnect material comprises forming the conductive interconnect material over and in electrical communication with the other substrate locations.

12. A method of forming a capacitor-over-bit line memory cell comprising:

forming a pair of spaced-apart word lines over a substrate having a diffusion region received therein and with which electrical communication with a bit line is desired;

forming an insulative material layer over the word lines;

forming a patterned bit line over the insulative material layer;

after forming the patterned bit line, etching a contact opening through the insulative material layer to proximate the diffusion region, the etching also outwardly exposing a portion of the patterned bit line; and forming conductive material within the contact opening and in electrical communication with the diffusion region and the patterned bit line;

wherein forming a patterned bit line comprises forming conductive bit line material over the insulative material layer;

wherein the substrate includes other diffusion regions different than said diffusion region, and wherein:

etching the contact opening comprises etching other contact openings over said other diffusion regions; and forming the conductive material within the contact opening comprises forming conductive material within the contact openings over the other diffusion regions.

13. The method of claim 12 further comprising forming storage capacitors over and in electrical communication with individual respective ones of said other diffusion regions through the conductive material formed thereover.

14. A method of forming a capacitor-over-bit line memory cell comprising:

forming a pair of spaced-apart word lines over a substrate having a diffusion region received therein and with which electrical communication with a bit line is desired;

forming an insulative material layer over the word lines;

forming a patterned bit line over the insulative material layer;

after forming the patterned bit line, etching a contact opening through the insulative material layer to proximate the diffusion region, the etching also outwardly exposing a portion of the patterned bit line; and forming conductive material within the contact opening and in electrical communication with the diffusion region and the patterned bit line;

wherein forming a patterned bit line comprises forming conductive bit line material over the insulative material layer;

wherein the substrate includes other diffusion regions different than said diffusion region, and wherein:

etching the contact opening comprises etching other contact openings over said other diffusion regions;

forming the conductive material within the contact opening comprises forming conductive material within the contact openings over the other diffusion regions;

forming an insulative covering over the conductive material within all of the contact openings;

removing material of the insulative covering only over the conductive material within the contact openings over the other diffusion regions;

forming an insulative oxide layer over the substrate;

etching a pair of capacitor openings through the insulative oxide layer over the other diffusion regions substantially selective to material of the insulative covering, the openings being self-aligned relative to the patterned bit line; and forming storage capacitors over and in electrical communication with individual respective other diffusion regions through the conductive material formed thereover.

15. A method of forming a capacitor-over-bit line memory cell comprising:

forming a pair of spaced-apart word lines over a substrate, the word lines having a substrate location therebetween with which electrical communication is desired with a bit line, and substrate locations on opposite sides thereof with which electrical communication is desired with individual respective storage capacitors;

forming an insulative material over the substrate locations;

forming a patterned bit line over the insulative material;

after forming the patterned bit line, forming contact openings over all of the substrate locations; and forming conductive material within the contact openings and in electrical communication with the respective substrate locations, wherein the forming of the contact openings comprises contemporaneously forming said contact openings.

16. The method of claim 15, wherein the forming of the contact openings comprises exposing the patterned bit line material.

17. The method of claim 16, wherein:

the removing of the conductive bit line material comprises also exposing other substrate locations different from the substrate location between the pair of spaced-apart word lines with which electrical communication with a bit line is desired; and the forming of the conductive interconnect material comprises forming the conductive interconnect material over and in electrical communication with the other substrate locations.

18. The method of claim 15, wherein the forming of the contact openings comprises etching through the patterned bit line material.

19. The method of claim 15 further comprising forming storage capacitors in electrical communication with the conductive material within the contact openings over the substrate locations on the opposite sides of the word lines.

20. The method of claim 19, wherein:

the removing of the conductive bit line material comprises also exposing other substrate locations different from the substrate location between the pair of spaced-apart word lines with which electrical communication with a bit line is desired; and the forming of the conductive interconnect material comprises forming the conductive interconnect material over and in electrical communication with the other substrate locations.

21. A method of forming a capacitor-over-bit line memory cell comprising:

forming a pair of spaced-apart word lines over a substrate, the word lines having a substrate location therebetween with which electrical communication is desired with a bit line, and substrate locations on opposite sides thereof with which electrical communication is desired with individual respective storage capacitors;

forming an insulative material over the substrate locations;

forming a patterned bit line over the insulative material;

after forming the patterned bit line, forming contact openings over all of the substrate locations;

forming conductive material within the contact openings and in electrical communication with the respective substrate locations;

forming storage capacitors in electrical communication with the conductive material within the contact openings over the substrate locations on the opposite sides of the word lines;

forming an insulative covering only over the contact opening over the substrate location between the word lines and effectively encapsulating the conductive material therewithin, and wherein the forming of the storage capacitors comprises:

forming an insulative oxide layer over the substrate; and selectively etching a pair of capacitor openings through the insulative oxide layer relative to the insulative covering, the capacitors being formed within respective individual ones of the pair of capacitor openings.

22. A method of forming a capacitor-over-bit line memory cell comprising:

forming a pair of spaced-apart word lines over a substrate, the word lines defining a plurality of substrate locations with which electrical communication is respectively desired with a bit line and a pair of storage capacitors;

forming an insulative material over the word lines;

forming a patterned bit line over the insulative material;

contemporaneously forming individual contact openings over the substrate locations; and forming conductive material within the contact openings and in electrical communication with the respective individual substrate locations.

23. The method of claim 22, wherein the substrate locations comprise diffusion regions received within the substrate.

24. A method of forming a capacitor-over-bit line memory cell comprising.

forming a pair of spaced-apart word lines over a substrate, the word lines defining a plurality of substrate locations with which electrical communication is respectively desired with a bit line and a pair of storage capacitors;

forming an insulative material over the word lines;

forming a patterned bit line over the insulative material;

contemporaneously forming individual contact openings over the substrate locations; and forming conductive material within the contact openings and in electrical communication with the respective individual substrate locations, wherein the forming of the contact openings comprises removing conductive material of the patterned bit line during said forming of the contact openings.

25. A method of forming a capacitor-over-bit line memory cell comprising:

forming a pair of spaced-apart word lines over a substrate having a substrate location therebetween with which electrical communication with a bit line is desired;

forming conductive bit line material over the word lines and the substrate location;

after forming the conductive bit line material, providing patterned bit line material by removing at least some of the conductive bit line material and outwardly exposing said substrate location;

contemporaneously forming individual contact openings over the substrate location;

forming conductive material within the contact openings and in electrical communication with the substrate location, wherein the forming of the contact openings comprises removing conductive material of the patterned bit line during said forming of the contact openings;

forming an insulative material layer over the conductive material;

exposing the conductive material only over the other substrate locations;

forming a different insulative material layer over the substrate; and etching capacitor openings through the different insulative material layer over the other substrate locations and exposing the interconnect material thereover.

26. The method of claim 25, wherein the forming of the conductive bit line material over the word lines comprises patterning and etching said conductive bit line material to form a bit line from the patterned bit line material.

27. The method of claim 25, wherein the removing of said at least some of the conductive bit line material comprises etching through said bit line.

28. The method of claim 25, wherein the forming of the conductive bit line material over the word lines comprises patterning and etching said conductive bit line material to form a bit line having a lateral width, and the removing of the at least some of the conductive bit line material comprises removing conductive bit line material within an entirety of the lateral width of a portion of the bit line.

29. The method of claim 25, wherein the removing of the at least some of the conductive bit line material comprises etching entirely through the conductive bit line material.

30. The method of claim 25, further comprising forming capacitors within the capacitor openings and in electrical communication with respective interconnect material therewithin.

* * * * *